(12) United States Patent
Kim et al.

(10) Patent No.: US 9,123,647 B2
(45) Date of Patent: Sep. 1, 2015

(54) CURABLE COMPOSITION

(71) Applicant: LG CHEM, LTD., Seoul (KR)

(72) Inventors: Min Kyoun Kim, Daejeon (KR); Min Jin Ko, Daejeon (KR); Myungsun Moon, Daejeon (KR); Jae Ho Jung, Daejeon (KR); Bum Gyu Choi, Daejeon (KR); Dae Ho Kang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/109,179

(22) Filed: Dec. 17, 2013

(65) Prior Publication Data

US 2014/0175333 A1    Jun. 26, 2014

Related U.S. Application Data

(60) Provisional application No. PCT/KR2012/004820, filed on Jun. 18, 2012.

(30) Foreign Application Priority Data

Jun. 17, 2011 (KR) .................. 10-2011-0059102

(51) Int. Cl.
| | |
|---|---|
| H01L 23/29 | (2006.01) |
| H01L 33/56 | (2010.01) |
| C08G 77/14 | (2006.01) |
| C08L 83/06 | (2006.01) |
| C08G 77/00 | (2006.01) |
| C08K 5/5435 | (2006.01) |

(52) U.S. Cl.
CPC .............. *H01L 23/296* (2013.01); *C08L 83/06* (2013.01); *H01L 33/56* (2013.01); *C08G 77/14* (2013.01); *C08G 77/80* (2013.01); *C08K 5/5435* (2013.01); *G02F 2202/28* (2013.01)

(58) Field of Classification Search
None
See application file for complete search history.

(56) References Cited

U.S. PATENT DOCUMENTS

| | | | | |
|---|---|---|---|---|
| 4,381,396 | A | * | 4/1983 | Ryang .................. 549/214 |
| 4,511,701 | A | * | 4/1985 | Ryang .................. 525/533 |
| 4,582,886 | A | * | 4/1986 | Ryang .................. 528/28 |
| 7,019,100 | B2 | * | 3/2006 | Tabei et al. ............... 528/43 |
| 7,022,410 | B2 | * | 4/2006 | Tonapi et al. ............ 428/414 |
| 7,160,972 | B2 | * | 1/2007 | Young et al. ............. 528/31 |
| 7,279,223 | B2 | * | 10/2007 | Rubinsztajn et al. ...... 428/414 |
| 7,879,405 | B2 | * | 2/2011 | Kaji et al. ................ 427/387 |
| 8,524,921 | B2 | * | 9/2013 | Kikuchi et al. ............ 549/214 |
| 2004/0198924 | A1 | | 10/2004 | Young et al. |
| 2005/0129956 | A1 | | 6/2005 | Rubinsztajn et al. |
| 2008/0001140 | A1 | * | 1/2008 | Haitko et al. .............. 257/40 |
| 2010/0171414 | A1 | * | 7/2010 | Tanikawa et al. ............ 313/502 |
| 2011/0027213 | A1 | * | 2/2011 | Kamei et al. ............ 424/78.03 |

FOREIGN PATENT DOCUMENTS

| | | |
|---|---|---|
| CN | 10121068 A | 7/2008 |
| EP | 2324079 A1 | 5/2011 |
| JP | 03-109428 A | 5/1991 |
| JP | 5-339279 A | 12/1993 |
| JP | 06-329681 A | 11/1994 |
| JP | 2004-359756 A | 12/2004 |
| JP | 2006-306957 A | 11/2006 |
| JP | 2008-120843 A | 5/2008 |
| JP | 2009-280769 A | 12/2009 |
| JP | 2011-063799 A | 3/2011 |
| KR | 10-2007-0016988 A | 2/2007 |
| KR | 10-2011-057136 A | 5/2011 |
| WO | 2010/026714 A1 | 3/2010 |

OTHER PUBLICATIONS

International Search Report issued in International Application No. PCT/KR2012/004820 on Dec. 14, 2012, 2 pages.
Supplementary European Search Report issued in European Patent Application No. 12 80 0817 on Dec. 23, 2014, 8 pages.
Database WPI Week 200903, Thomson Scientific, London, GB, XP-002733802, Jul. 2, 2008, 4 pages.
H. Li et a.: "The Study of Thermal Properties and Thermal Resistant Behaviors of Siloxane-modified LED Transparent Encapsulant," Microsystems, Packaging, Assembly and Circuits Technology, Oct. 1, 2007, 4 pages.
Database WPI Week 199404, Thomson Scientific, London, GB, XP-002733803, Dec. 21, 1993, 3 pages.

* cited by examiner

*Primary Examiner* — Robert S Loewe
(74) *Attorney, Agent, or Firm* — Rothwell, Figg, Ernst & Manbeck, P.C.

(57) ABSTRACT

Provided are a curable composition, a light emitting diode, a liquid crystal display, and a lighting apparatus. The curable composition may have excellent processability and workability, and excellent crack resistance, hardness, thermal resistance, transparency and adhesiveness after curing. The composition has neither whitening after being applied nor surface stickiness. The composition may be useful as an adhesive or encapsulating material of an optical semiconductor device such as an LED, a CCD or a photocoupler.

17 Claims, No Drawings

CURABLE COMPOSITION

CROSS REFERENCE TO RELATED APPLICATIONS

The present application is a continuation application of International Application PCT/KR2012/004820, with an international filing date of Jun. 18, 2012, which claims priority to and the benefit of Korean Patent Application No. 10-2011-0059102, filed Jun. 17, 2011, the disclosures of which are incorporated herein by reference in their entireties.

TECHNICAL FIELD

The present application relates to a curable composition, a light emitting diode (LED), a liquid crystal display and a lighting apparatus.

BACKGROUND ART

As an adhesive or encapsulating material used in an LED, an epoxy resin having a high adhesive strength and excellent durability has been mainly used. However, since an epoxy resin has a low transmittance with respect to light in a blue or UV region and a low light resistance, attempts have been made to solve these problems, for example, in References 1 to 3.

REFERENCES

Reference 1: Japanese Patent Application Publication Laid-Open No. Hei-11-274571
Reference 2: Japanese Patent Application Publication Laid-Open No. 2001-196151
Reference 3: Japanese Patent Application Publication Laid-Open No. 2002-226551

DISCLOSURE

Technical Problem

The present application provides a curable composition, an LED, a light crystal display, and a light apparatus.

Technical Solution

Illustrative curable composition may include a silicon resin including a cyclic ether group and a silicon modified alicyclic acid anhydride curing agent. The silicon resin may include an aryl group, for example, an aryl group binding to a silicon atom. In addition, the curing agent may also include an aryl group, for example, an aryl group binding to a silicon atom.

The term "M unit" used herein may refer to a monofunctional siloxane unit that is usually represented by Formula [$R_3SiO_{1/2}$], the term "D unit" may refer to a bifunctional siloxane unit that is usually represented by "$R_2SiO_{2/2}$", the term "T unit" may refer to a trifunctional siloxane unit that is usually represented by [$RSiO_{3/2}$], and the term "Q unit" may refer to a tertfunctional siloxane unit usually represented by [$SiO_{4/2}$]. Here, R is a substituent binding to a silicon atom, which may be, for example, as will be described later, hydrogen, a hydroxyl group, an acryl group, a methacryl group, an acryloyl group, a methacryloyl group, an isocyanate group, a cyclic ether group or a monovalent hydrocarbon group.

The silicon resin includes a cyclic ether group. Unless particularly defined otherwise, the term "cyclic ether group" refers to a monovalent residue induced from a compound including an ether functional group disposed in a ring structure or a derivative thereof.

As the cyclic ether group, an epoxy group; an oxetane group; an epoxyalkyl group, a glycidoxyalkyl group or an alicyclic epoxy group may be used. The epoxyalkyl group or glycidoxyalkyl group may be an epoxyalkyl group or glycidoxyalkyl group including an alkyl group having 1 to 20, 1 to 16, 1 to 12, 1 to 8 or 1 to 4 carbon atoms such as a 2,3-epoxypropyl group, a 3,4-epoxybutyl group, a 4,5-epoxypentyl group, a 2-glycidoxyethyl group, a 3-glycidoxypropyl group or a 4-glycidoxybutyl group. In addition, the alicyclic epoxy group may be a functional group such as a 3,4-epoxycyclopentyl group, a 3,4-epoxycyclohexyl group, a 3,4-epoxycyclopentylmethyl group, a 3,4-epoxycyclohexylmethyl group, a 2-(3,4-epoxycyclopentyl)ethyl group, a 2-(3,4-epoxycyclohexyl)ethyl group, a 3-(3,4-epoxycyclopentyl)propyl group or a 3-(3,4-epoxycyclohexyl)propyl. In consideration of thermal resistance, the cyclic ether group may be, but is not limited to, an alicyclic epoxy group.

In the silicon resin, a molar ratio (cyclic ether group/Si) of the cyclic ether group with respect to the total number of silicon (Si) atoms included in the resin may be approximately 0.05 to 0.3, 0.1 to 0.2, or 0.1 to 0.18. As the molar ratio is controlled to 0.05 or more, the curability of the curable composition may be excellently maintained, and as the molar ratio is controlled to 0.3 or less, physical properties of the curable composition such as viscosity and thermal resistance may be excellently maintained.

The silicon resin may have, for example, an average composition formula of Formula 1:

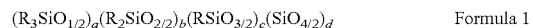

$$(R_3SiO_{1/2})_a(R_2SiO_{2/2})_b(RSiO_{3/2})_c(SiO_{4/2})_d \qquad \text{Formula 1}$$

In Formula 1, R is a substituent binding to a silicon atom, and each independently hydrogen, a hydroxyl group, a cyclic ether group, an acryl group, a methacryl group, an acryloyl group, a methacryloyl group, an isocyanate group, an alkoxy group or a monovalent hydrocarbon group. At least one R is a cyclic ether group, at least one R is an aryl group, and when a+b+c+d is set to 1, a is 0 to 0.5, b is 0 to 0.3, c is 0.3 to 0.85, and d is 0 to 0.2.

In the specification, the sentence "the silicon resin is represented by a predetermined average composition formula" includes the case in which at least one silicon resin represented by the predetermined average composition formula is included in the curable composition, and the case in which a plurality of silicon resin components are present in the curable composition in an average ratio of the curable composition.

In Formula 1, R is a substituent directly binding to a silicon atom, and each of the Rs may be equal to or different from each other. The Rs are each independently hydrogen, a hydroxyl group, a cyclic ether group, an acryl group, a methacryl group, an acryloyl group, a methacryloyl group, an isocyanate group, an alkoxy group or a monovalent hydrocarbon group, at least one R is a cyclic ether group, and at least one R is an aryl group. Here, an R may be subject to substitution with at least one substituent in some cases. The substituent capable of substituting for R may be, but is not limited to, halogen, a hydroxyl group, an epoxy group, an acryl group, a methacryl group, an acryloyl group, a methacryloyl group, an isocyanate group, an alkoxy group, a thiol group or a monovalent hydrocarbon group.

The term "alkoxy group" may refer to, unless particularly defined otherwise, an alkoxy group having 1 to 20, 1 to 16, 1 to 12, 1 to 8 or 1 to 4 carbon atoms. The alkoxy group may be linear, branched or cyclic, and subject to substitution with at least one substituent.

The term "monovalent hydrocarbon group" may refer to a monovalent residue produced from a compound consisting of carbon and hydrogen or a compound in which at least one hydrogen in the compound consisting of carbon and hydrogen is subject to substitution with an arbitrary substituent. The monovalent hydrocarbon group may include, for example, 1 to 20, 1 to 16, 1 to 12, 1 to 8 or 1 to 4 carbon atoms. As the monovalent hydrocarbon group, an alkyl group, an alkenyl group, an alkynyl group, an aryl group, or an alicyclic hydrocarbon group may be used.

The term "alkyl group" used herein may refer to, unless specifically defined otherwise, an alkyl group having 1 to 20, 1 to 16, 1 to 12, 1 to 8 or 1 to 4 carbon atoms. The alkyl group may be linear, branched or cyclic, and may be arbitrarily subject to substitution with at least one substituent.

The term "alkenyl group" used herein may refer to, unless specifically defined otherwise, an alkenyl group having 2 to 20, 2 to 16, 2 to 12, 2 to 8 or 2 to 4 carbon atoms. The alkenyl group may be linear, branched or cyclic, and may be arbitrarily subject to substitution with at least one substituent.

In addition, the term "alkynyl group" used herein may refer to, unless particularly defined otherwise, an alkynyl group having 2 to 20, 2 to 16, 2 to 12, 2 to 8 or 2 to 4 carbon atoms. The alkynyl group may be linear, branched or cyclic, and may be arbitrarily subject to substitution with at least one substituent.

The term "aryl group" may refer to a monovalent residue having a benzene ring or derived from a compound including a structure in which at least two benzene rings are connected or condensed, or a derivative thereof. That is, in the range of the "aryl group", an aralkyl group, arylalkyl group, and a functional group conventionally referred to as an aryl group may be included. The aryl group may be, for example, an aryl group having 6 to 25 or 6 to 21 carbon atoms. The aryl group may be a phenyl group, a dichlorophenyl group, a chlorophenyl group, a phenylethyl group, a phenylpropyl group, a benzyl group, a tolyl group, a xylyl group or a naphthyl group, and in one example, is a phenyl group.

The term "alicyclic hydrocarbon group" may refer to a monovalent residue derived from a compound, not an aromatic compound, as a compound including carbon atoms bound in a ring type, or a derivative thereof. The alicyclic hydrocarbon group may be a hydrocarbon group having 3 to 20 or 5 to 20 carbon atoms. Such a hydrocarbon group may be, but is not limited to, for example, a cyclohexyl group, a norbornanyl group, a norbornenyl group, a dicyclopentaldienyl group, an ethynylcyclohexane group, an ethynylcyclohexene group, or an ethynyldecahydronaphthalene group. In one example, the hydrocarbon group may be a norbonanyl group, but the present application is not limited thereto.

In Formula 1, a, b, c and d are mole fractions of respective siloxane units, and when a+b+c+d is set to 1, a may be 0 to 0.5, b may be 0 to 0.3, c may be 0.3 to 0.85, and d may be 0 to 0.2. However, b and c are not simultaneously 0. That is, the resin of Formula 1 may be a resin essentially including a T unit.

The silicon resin may include a cyclic ether group, and thus at least one R in Formula 1 may be a cyclic ether group, for example, an alicyclic epoxy group. In the silicon resin, the silicon atom bound with the cyclic ether group may be included in the T unit. For example, the silicon resin of Formula 1 may include a unit represented by Formula 2 as the T unit bound with the cyclic ether group.

[R$^1$SiO$_{3/2}$]  Formula 2

In Formula 2, R$^1$ is a cyclic ether group, for example, an alicyclic epoxy group.

The silicon resin may include at least one aryl group in consideration of characteristics of a cured product such as a refractive index and hardness. Accordingly, in Formula 1, at least one R may be an aryl group, for example, a phenyl group. In one example, a molar ratio (Ar/Si) of an aryl group (Ar) with respect to the total number of silicon (Si) atoms included in the silicon resin may be more than 0.5, 0.6 or 0.7. In such a range, characteristics such as viscosity, cured product, refractive index and hardness of the curable composition may be suitably maintained. The upper limit of the molar ratio (Ar/Si) of the aryl group may be, but is not limited to, for example, 2.0, 1.5, 1.0, 0.9, 0.89 or 0.85.

In the silicon resin, the silicon atom bound with an aryl group may be included in a D or T unit. In one example, an aryl group included in the silicon resin having the average composition formula of Formula 1 may be entirely included in the D or T unit.

For example, the D unit bound with an aryl group is a siloxane unit represented by Formula 3, and the T unit bound with an aryl group may be a siloxane unit represented by Formula 4.

[R$^2$R$^3$SiO$_{2/2}$]  Formula 3

[R$^4$SiO$_{3/2}$]  Formula 4

In Formulas 3 and 4, R$^2$ and R$^3$ are each independently an alkyl group or an aryl group, at least one of R$^2$ and R$^3$ is an aryl group, and R$^4$ is an aryl group.

The unit of Formula 3 is a D unit including an aryl group bound with at least one silicon atom. The siloxane unit of Formula 3 may be a siloxane unit of Formula 5 or 6.

(C$_6$H$_5$)(CH$_3$)SiO$_{2/2}$  Formula 5

(C$_6$H$_5$)$_2$SiO$_{2/2}$  Formula 6

In one example, a molar ratio (Ar/Si) of an aryl (Ar) group included in the siloxane unit of Formula 3 with respect to the total number of silicon (Si) atoms included in the silicon resin, or a ratio ((Ar+Ak)/Si) of the sum of a mole number of an aryl (Ar) group and a mole number of an alkyl (Ak) group included in the siloxane unit of Formula 3 with respect to a mole number of the total number of silicon (Si) atoms included in the silicon resin, may be 0.5 to 0.9 or 0.7 to 0.85. In these ranges, light extraction efficiency of a cured product may be excellently maintained, and the viscosity of the curable composition may be maintained in a range suitable for a process.

Formula 4 is a T unit including an aryl group bound to the silicon atom, for example, a siloxane unit represented by Formula 7.

(C$_6$H$_5$)SiO$_{3/2}$  Formula 7

In the silicon resin, a molar ratio (Ar/Si) of the aryl (Ar) group included in the unit of Formula 4 with respect to the total number of silicon (Si) atoms included in the resin may be, for example, approximately 0.5 to 0.9 or 0.7 to 0.85. In these ranges, light extraction efficiency of the cured product may be excellently maintained, and the viscosity of the curable composition may be maintained in the range suitable for the process.

The silicon resin may include at least one alicyclic hydrocarbon group in consideration of physical properties such as thermal resistance. Accordingly, in Formula 1, at least one R may be an alicyclic hydrocarbon group. In the resin, an amount of the alicyclic hydrocarbon group is not particularly limited, but may be suitably selected in consideration of thermal resistance.

The silicon resin may have, for example, a viscosity at 25° C. of approximately 1,000 to 20,000 or 3,000 to 7,000 mPa·s. In such ranges of viscosity, processability or hardness after curing of the curable composition may be excellently maintained.

The silicon resin may have a weight average molecular weight (Mw) of, for example, 1,500 to 7,000 or 3,000 to 5,000. As the weight average molecular weight is controlled in these ranges, viscosity or processability of the curable composition may be excellently maintained. The term "weight average molecular weight" refers to a conversion value with respect to standard polystyrene measured by gel permeation chromatography (GPC). In the specification, unless particularly defined otherwise, the term "molecular weight" may refer to a weight average molecular weight.

A method of preparing the silicon resin is not particularly limited, and the silicon resin may be synthesized by a common method known in the art. For example, the silicon resin may be prepared using (1) hydrosilylation of a silicon compound including a hydrogen atom bound to a silicon atom and a silicon compound including an alkenyl group bound to the silicon atom, (2) hydrolysis and condensation of organohalosilane and/or organoalkoxysilane, (3) reequilibrated polymerization, or (4) ring-opening of cyclic organosiloxane. Various raw materials and reaction conditions that can be used in consideration of a desired resin are known in the art, and one of ordinary skill in the art may employ these conventional raw materials and conditions to easily prepare the desired silicon resin.

The curable composition includes a silicon modified alicyclic acid anhydride curing agent as a curing agent. The term "silicon modified alicyclic acid anhydride curing agent" refers to a curing agent including a siloxane unit, in which at least one or two substituents bound to a silicon atom therein are alicyclic anhydride functional groups. By using such a curing agent, a cured product having a suitable glass transition temperature and excellent hardness may be provided. In addition, a cured product in which a diode does not have functional degradation or damage caused by cracks or internal stress due to excellent flexibility may be provided.

In one example, the curing agent may be represented by Formula 8.

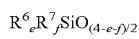

Formula 8

In Formula 8, $R^6$ is

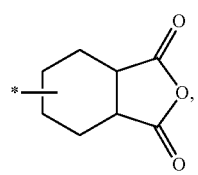 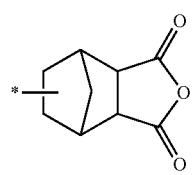 or or an alkyl group subject to substitution with

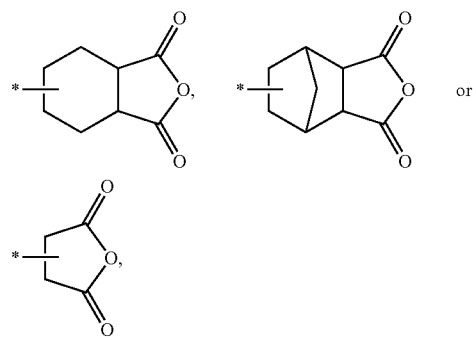

$R^7$ is hydrogen, a hydroxyl group, a monovalent hydrocarbon group or $—OR_8$, in which $R_8$ is a monovalent hydrocarbon group, e and f are numbers satisfying $0<e\leq3$, $0<f\leq2.5$, and $0<e+f\leq3$. When $R^6$ and $R^7$ are plural, they may be equal to or different from each other.

In defining the substituents of Formula 8, the mark "*" indicates a part that binds to a silicon atom, or is subject to substitution with an alkyl group.

In Formula 8, $R^6$ is, for example,

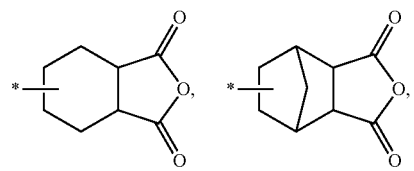

or an alkyl group subject to substitution with one of the functional groups. In another example, $R^6$ may be

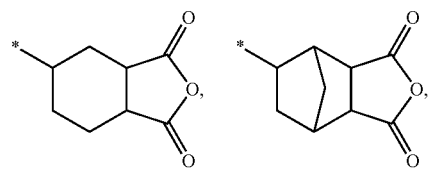

or an alkyl group subject to substitution with one of the functional groups.

In addition, in Formula 8, $R^7$ may be a monovalent hydrocarbon group, for example, an alkyl group or aryl group.

The curing agent may include at least one aryl group in consideration of a refractive index and hardness of the cured product. Accordingly, in Formula 8, at least one of $R^7$ may be an aryl group, for example, a phenyl group. In one example, a molecular weight (Ar/Si) of an aryl (Ar) group with respect to the total number of silicon (Si) atoms included in the curing agent may be more than 0.6, 0.6 to 2.0 or 0.6 to 1.5, and in these ranges, the viscosity of the curable composition, and the refractive index and hardness of the cured product, may be excellently maintained.

In one example, the compound of Formula 8 may be represented by Formula 9.

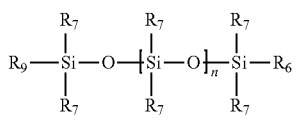

Formula 9

In Formula 9, $R_9$ is each independently $R^6$ or $R^7$, at least one $R_9$ is $R^6$, and n is 0 to 10.

In Formula 9, $R^6$, that is, an alicyclic acid anhydride group may be bound to a silicon atom in a terminal end of a siloxane chain, but the present application is not limited thereto. In addition, here, n is 1 to 10, for example, 1 to 6.

The compound of Formula 8 may be represented by, for example, Formula 10 or Formula 11.

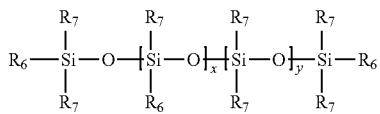

Formula 10

In Formula 10, $R_6$ is the same as $R^6$, and $R_7$ is an alkyl group or an aryl group. Here, at least one $R_7$ is an aryl group, x and y are each independently a number of 0 or more, and x+y is 0 to 10, 1 to 10, or 1 to 6.

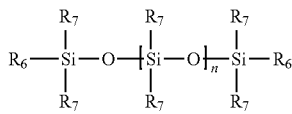

Formula 11

In Formula 11, $R_6$ is the same as $R^6$, and $R_7$ is an alkyl group or an aryl group. Here, at least one $R_7$ is an aryl group, and n is 0 to 10, 1 to 10, or 1 to 6.

A method of preparing the alicyclic acid anhydride curing agent is not particularly limited, but the alicyclic acid anhydride curing agent may be prepared by, for example, hydrosylylation of a suitable raw material.

The curable composition may include, for example, 5 to 60, 5 to 40 or 5 to 30 parts by weight of the silicon modified alicyclic acid anhydride curing agent with respect to 100 parts by weight of the silicon resin.

In the specification, the unit "parts by weight" refers to weight ratios between components.

The curable composition may further include a different curing agent when necessary, in addition to the silicon modified alicyclic acid anhydride curing agent. The curing agent may be a compound including at least one functional group capable of reacting with a cyclic ether group, which may be, but is not limited to, for example, a carbonic acid compound; an acid anhydride; an amino compound; a modified resin polyamine such as an epoxy resin-diethylenetriamine addition product, an amine-ethyleneoxide addition product or a cyanoethylated polyamine; or a phenol compound such as phenol, bisphenol A, bisphenol F or tetrabromobisphenol A, preferably a carbonic acid compound or acid anhydride, more preferably, an alicyclic carbonic acid compound or alicyclic acid anhydride, and even more preferably, an alicyclic acid anhydride curing agent. Here, as the alicyclic carbonic acid compound, cyclohexane tricarbonic acid such as cyclohexane-1,2,4-tricarbonic acid, cyclohexane-1,3,5-tricarbonic acid or cyclohexane-1,2,3-tricarbonic acid may be used. In addition, here, as the alicyclic acid anhydride curing agent, a cyclohexane-1,3,4-tricarbonic acid-3,4-anhydride, cyclohexane-1,3,5-tricarbonic acid-3,5-anhydride, cyclohexane-1,2,3-tricarbonic acid-2,3-anhydride may be used, but the present application is not limited thereto.

A content of the additional curing agent in the curable composition may be suitably selected in consideration of curability of the curable composition without particular limitation.

The curable composition may further include a curing catalyst. As the curing catalyst, for example, a phosphine compound such as triphenylphosphine, tributylphosphine, tri(p-methylphenyl)phosphine, tri(nonylphenyl)phosphine, triphenylphosphine/triphenylborate or triphenylphosphine/tetraphenylborate; phosphonium salt; a tertiary amine compound such as triethylamine, benzyldimethylamine or α-methylbenzyldimethylamine; or an imidazole compound such as 2-methylimidazole, 2-phenylimidazole or 2-phenyl-4-methylimidazole may be used, but the present application is not limited thereto.

A content of the curing catalyst may be, for example, 0.5 to 2 parts by weight with respect to 100 parts by weight of the above-described silicon resin.

The curable composition may further include an organic compound having at least two epoxy group in one molecule. As the organic compound, for example, a known liquid or solid epoxy resin may be used. For example, the organic compound may be epoxy resins (e.g., a phenol novolac-type epoxy resin, a cresol novolac-type epoxy resin, etc.) synthesized from various novolac resins formed of epichlorohydrin and bisphenol, alicyclic epoxy resins (e.g., 3,4-epoxycyclohexylmethyl-3',4'-epoxycyclohexanecarboxylate or bis(3,4-cyclohexylmethyl)adipate, etc.) having an epoxy cyclohexane ring, a non-phenyl-type epoxy resin, a naphthalene-type epoxy resin, a triphenylmethane-type epoxy resin, a glycidyl ether compound of an aliphatic polyhydric alcohol, a glycidyl ester compound of a polyvalent carbonic acid, triglycidyl isocyanurate, or epoxy resins to which a halogen atom such as a chlorine or fluorine atom, which may be used alone or in combination of at least two thereof. Among the organic compounds, a bisphenol-type epoxy resin that is less colored (e.g., a bisphenol A-type epoxy resin, a hydrogenated bisphenol A-type epoxy resin, a brominated bisphenol A-type epoxy resin, a bisphenol F-type epoxy resin or a bisphenol S-type epoxy resin) or alicyclic epoxy resin is preferably used.

A content of the organic compound may be suitably selected in consideration of desired physical properties, and the organic compound may be included, for example, at 5 to 25 parts by weight with respect to 100 parts by weight of the silicon resin.

The curable composition may further include a plasticizer, a peeler, a flame-retardant, an antioxidant, a UV absorbent, a pigment or a dye (e.g., titanium dioxide, carbon black or iron oxide) as needed. In addition, the curable composition may include a reinforcing silica filler prepared by treating any one of silica, silica aerogel and silicagel with organic silane, organic siloxane or organic silazane, and asbestos, grinded melted quartz, aluminum oxide, aluminum silicate, zirconium silicate, magnesium oxide, zinc oxide, talc, diatomaceous earth, mica, calcium carbonate, clay, zirconia, glass, graphite, barium acetate, zinc sulfate, aluminum powder, powder of fluorocarbon polymer, silicon rubber powder or silicon resin powder. When the additive is included, the content thereof is not particularly limited, and may be suitably selected in consideration of a desired physical property.

Another aspect of the present application provides an LED including a light emitting device encapsulated with a cured product of the curable composition.

The kind of the light emitting device is not particularly limited. For example, a light emitting device formed by stacking a semiconductor material on a substrate may be used. The semiconductor material may be, for example, GaAs, GaP, GaAlAs, GaAsP, AlGaInP, GaN, InN, AlN, InGaAlN or SiC. The substrate may be, for example, sapphire, spinnel, SiC, Si, ZnO or GaN monocrystal, but the present application is not limited thereto.

In the LED, a buffer layer may be further formed between the substrate and the semiconductor layer as needed. As the buffer layer, GaN or AlN may be used. A method of stacking the semiconductor material on the substrate may be, but is not particularly limited to, for example, MOCVD, HDVPE or liquid growth. In addition, a structure of the light emitting device may be, for example, MIS junction, PN junction, monojunction having PIN junction, heterojunction or double heterojunction. In addition, the light emitting device may be formed in a single or multiple quantum well structure.

In one example, an emission wavelength of the light emitting device may be, for example, 250 nm to 550 nm, 300 nm to 500 nm or 330 nm to 470 nm. The emission wavelength may refer to a main emission peak wavelength. When the emission wavelength of the light emitting device is set in the above ranges, a white LED having a long life span, high energy efficiency and excellent color gamut may be obtained.

The LED may be manufactured by encapsulating a light emitting device, particularly, a light emitting device having an emission wavelength of 250 to 550 nm, with the curable composition. In this case, the light emitting device may be encapsulated only with the curable composition, or in combination with another encapsulant in some cases. In the case of combination, after encapsulation is performed using the curable composition, a periphery of the encapsulation may be encapsulated again with another encapsulant, or encapsulation is performed first using an encapsulant and then the periphery thereof may be encapsulated with the curable composition. As the encapsulant, an epoxy resin, a silicon resin, an acryl resin, a urea resin, an imide resin or glass may be used.

To encapsulate the light emitting device with the curable composition, for example, a method including previously injecting the curable composition into a mold-type mold, dipping a lead frame to which the light emitting device is fixed therein, and curing the curable composition, or a method including injecting the curable composition into a mold into which the LED is inserted and curing the curable composition. As a method of injecting the curable composition, injection by a dispenser, transfer molding or injection molding may be used. In addition, as other encapsulating methods, a method of coating the curable composition by dropping, screen printing or using a mask on the LED and curing the curable composition, or a method of injecting the curable composition into a cup in which the light emitting device is disposed on its bottom by a dispenser and curing the curable composition, may be used. In addition, the curable composition may be used as a diamond material fixing the light emitting device to a lead terminal or package, or a passivation layer dispersed on the light emitting device or package substrate. A shape of the encapsulant is not particularly limited, and for example, may be a bullet-type lens, planar, or thin film shape.

In addition, additional enhancement of performance of the LED may be promoted according to conventional methods known in the related art. To enhance performance, for example, a method of disposing a reflective layer or light collecting layer on a back surface of the light emitting device, a method of forming a complementary coloring part on its bottom, a method of disposing a layer absorbing light having a shorter wavelength than the main emission peak on the light emitting device, a method of encapsulating the light emitting device and further molding the light emitting device with a lightweight material, a method of inserting the LED into a through hole to be fixed, or a method of contacting the light emitting device with a lead member by flip-chip contact to extract light from a direction of the substrate, may be used.

The LED may be effectively applied to, for example, backlights for liquid crystal displays (LCDs), lighting apparatuses, various kinds of sensors, light sources of a printer and a copy machine, light sources for a mobile gauge, signal lights, pilot lights, display devices, light sources of flat-screen LEDs, displays, decorations or various kinds of lightings.

Advantageous Effects

In the present application, a curable composition having excellent processibility and workability, and after curing, also having excellent crack resistance, hardness, thermal resistance, thermal and shock resistance, transparency and adhesiveness is provided. The curable composition has no whitening after being applied, and no stickiness on a surface. The curable composition can be effectively used as an adhesive material or encapsulating material, for example, in an optical semiconductor device such as an LED, a charge coupled device (CCD) or a photocoupler.

MODES FOR INVENTION

A curable composition will be described in detail with reference to Examples and Comparative Examples, but the scope of the curable composition is not limited to the following Examples.

Hereinafter, in Examples, the abbreviation "Ep" refers to a 2-(3,4-epoxycyclohexyl)ethyl group, the abbreviation "Me" refers to a methyl group, and the abbreviation "Ph" refers to a phenyl group.

Hereinafter, each physical property is measured by the following method.

1. Measurement of Light Transmittance

Curable compositions prepared in Examples and Comparative Examples were coated on a glass substrate and cured, thereby forming a layer having a thickness of 1 mm. Light transmittance was measured at wavelengths of 350 and 450 nm using a UV-Vis spectro-photometer, right after the cured layer was formed, and evaluated according to the following criteria.

<Evaluation Criteria>

○: light transmittance measured at each wavelength was more than 98%

Δ: light transmittance measured at each wavelength was 96 to 97% x: light transmittance measured at each wavelength was less than 95%

2. Measurement of Thermal Resistance

The curable compositions prepared in Examples and Comparative Examples were coated on a glass substrate and cured, thereby forming a layer having a thickness of 1 mm. Sequentially, the cured layer was maintained in an oven at 100° C. for 400 hours, and light transmittance was measured at wavelengths of 350 and 450 nm using a UV-Vis spectro-photometer. The measured results were compared with a light transmittance right after the cured layer was formed (an initial transmittance), and evaluated according to the following criteria.

<Evaluation Criteria>

○: light transmittance decreased by less than 2% of the initial transmittance

Δ: light transmittance decreased by 2 to less than 10% of the initial transmittance x: light transmittance decreased by 10% or more of the initial transmittance 3. Measurement of Light Resistance The curable compositions prepared in Examples and Comparative Examples were coated on a glass substrate and cured, thereby forming a layer having a thickness of 1 mm. Sequentially, the cured layer was placed on a hot plate set at a temperature of 150° C., irradiated with light with a wavelength of 356 nm at 50 to 100 Mw/cm² using a spot UV radiator, and maintained for 500 hours. Afterward, using the UV-Vis spectro-photometer, light transmittance was measured at wavelengths of 350 and 450 nm and evaluated according to the following criteria.

<Evaluation Criteria>

○: light transmittance decreased by less than 10% of the initial transmittance

Δ: light transmittance decreased by 10 to less than 49% of the initial transmittance x: light transmittance decreased by 50% or more of the initial transmittance 4. Surface Stickiness The curable compositions prepared in Examples and Comparative Examples were coated on a glass substrate and cured, thereby forming a layer having a thickness of 1 mm. Subsequently, indentation energy was measured with a 1.00 inch ball using a Texture analyzer, and evaluated according to the following criteria.

<Evaluation Criteria>

○: indentation energy was 550 gmm or less

Δ: indentation energy was more than 550 to 700 gmm x: indentation energy was more than 700 gmm

SYNTHESIS EXAMPLE 1

Synthesis of Silicon Resin (A)

Dimethoxymethylphenyl silane and 2-(3,4-epoxycyclohexyl)ethyltrimethoxy silane were mixed in a molar ratio (dimethoxymethylphenyl silane:2-(3,4-epoxycyclohexyl) ethyltrimethoxysilane) of 4.78:1, and then the mixture was diluted with toluene at the same weight as a total weight of the mixture. Subsequently, a reaction vessel was equipped with a condenser and purged with nitrogen at 25° C., and then the mixture was uniformly stirred. Afterward, a KOH aqueous solution was prepared by mixing 4.00 equivalent weight of water with respect to total alkoxy groups (methoxy groups) bound to the silane compound in the mixture, and KOH having a mole number of 0.7% with respect to a total mole number of the silane compound in the mixture, and added in drops to the mixture. Then, the temperature of the reaction vessel was increased to 50° C. and the reaction was performed for approximately 150 minutes. After the reaction, a reaction product was cooled, 1.2 equivalent weight of acetic acid (AcOH) with respect to KOH blended into the KOH aqueous solution was added to the reaction product to acidify. Then, the reaction was terminated by adding ether and distilled water, and an organic layer was washed three times with water and dried with MgSO₄. An organic solvent was filtrated and stirred at approximately 25° C. in a vacuum to remove remaining ether. The reaction product from which the remaining ether was removed was dried on a hot plate at 120° C. for 20 minutes, and its weight was measured. Toluene was added to have a total solid content (TSC) of 50 weight % with respect to the measured weight. Subsequently, a dean stark kit was equipped, and then the resulting product was dried at 90° C. for 20 minutes to remove methanol. Afterward, a KOH aqueous solution was prepared by mixing 0.4 weight % of water with respect to the weight of the reaction product measured, and 0.004 weight % of KOH with respect to the weight of water. The KOH aqueous solution was added to the reaction product from which methanol was removed, and the mixture was heated to 120° C. while the dean-stark kit was filled with toluene to perform a reaction for 4 hours. After the reaction was terminated, the transparent reaction mixture which was almost dehydrated was cooled to room temperature, 1.2 equivalent weight of acetic acid with respect to KOH in the KOH aqueous solution was added, and then ether was added. After pouring in distilled water, an organic layer was washed three times, dried with MgSO₄, and filtrated to remove the organic solvent. Afterward, the reaction product was maintained overnight at 90° C. in a vacuum, and toluene was dried, thereby obtaining a silicon resin (equivalent weight of epoxy: 1291.71 g/mol) represented by Formula A, which had a viscosity of 6000 mPa·s, a weight average molecular weight of 2410, a ratio (Mw/Mn) between a number average molecular weight and a weight average molecular weight of 2.976, and a cyclic ether group.

$$(MePhSiO_{2/2})_{5.20}(EpSiO_{3/2})_{1.00} \qquad \text{Formula A}$$

SYNTHESIS EXAMPLE 2

Synthesis of Silicon Resin (B)

A silicon resin represented by Formula B was prepared as described in Synthesis Example 1, except that a reaction was performed by controlling a blending ratio of raw materials.

$$(MePhSiO_{2/2})_{9}(EpSiO_{3/2})_{10} \qquad \text{Formula B}$$

SYNTHESIS EXAMPLE 3

Synthesis of Silicon-Modified Acid Anhydride Curing Agent (A)

(1) Synthesis of Silicon Compound

Diphenyl silanol (Aldrich) was put into a double-neck rounded flask, anhydrous ether was added at a weight 12 times the weight of phenyl groups included in the silanol, and then the resulting mixture was stirred.

HSiMe₂Cl (4.0 equivalent weight with respect to 1 equivalent weight of the disilanol) and triethylamine (3.7 equivalent weight with respect to 1 equivalent weight of the disilanol) were respectively poured into two separate funnels, and simultaneously added, at higher speed for the HSiMe₂Cl than for the triethylamine, at 0° C. to react. After termination of the reaction, anhydrous ether was suitably added in consideration of stirring efficiency, a temperature was increased to room temperature, and stirring was performed for 4.5 hours. After stirring, a salt component was filtrated using a glass filter, the anhydrous ether was washed, and an organic layer was washed twice with distilled water. Afterward, the reaction product was washed using a NaHCO₃ aqueous solution to neutralize, and further washed twice with distilled water. The resulting product was dried with MgSO₄ and filtrated to remove the organic solvent, thereby obtaining a silicon compound of Formula B with a yield of approximately 85%.

$$(Me_2HSiO_{1/2})(Ph_2SiO_{2/2})(Me_2HSiO_{1/2}) \qquad \text{Formula B}$$

(2) Synthesis of Silicon-Modified Acid Anhydride Curing Agent (A)

The compound of Formula B was put into a double-neck rounded flask and diluted with a tetrahydrofuran (THF) solvent to have a concentration of 70 weight %. Subsequently, a platinum catalyst (Pt(0)-2,4,6,8-tetramethyltetravinylcyclotetrasiloxane) was added at 0.25 weight % with respect to the weight of the compound of Formula B. The flask was equipped with a condenser and a dropping funnel, and purged with nitrogen. Subsequently, the temperature was increased to 50° C., 2.10 equivalent weight of maleic anhydride with respect to 1 equivalent weight of the compound of Formula B was slowly added in drops through the dropping funnel. After dropping, the reaction was performed while stirring for 4 hours, the product was cooled to room temperature, charcoal (an amount of 5 weight % with respect to the weight of the reaction product) was added, and stirring was further performed for 2 hours. Afterward, the resulting product was filtrated using a Celite filter to remove the platinum catalyst and the charcoal, dried with $MgSO_4$, and evaporated to remove the organic solvent and unreacted anhydride. Afterward, a crude reaction product was dried at 50° C. in a vacuum, thereby obtaining a curing agent represented by Formula C (equivalent weight of the anhydride: 264.37 g/mol).

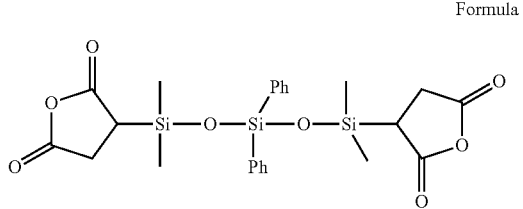

Formula C

SYNTHESIS EXAMPLE 4

Synthesis of Silicon-Modified Acid Anhydride Curing Agent (B)

The compound of Formula B was put into a double-neck rounded flask and diluted with a tetrahydrofuran (THF) solvent to have a concentration of 70 weight %. Subsequently, a platinum catalyst (Pt(0)-2,4,6,8-tetramethyltetravinylcyclotetrasiloxane) was added at 0.25 weight % with respect to the weight of the compound of Formula B. The flask was equipped with a condenser and a dropping funnel, and purged with nitrogen. Subsequently, the temperature was increased to 50° C. and 2.10 equivalent weight of cis-5-norbonene-exo-2,3-dicarboxylic acid anhydride with respect to 1 equivalent weight of the compound of Formula B was slowly added in drops through the dropping funnel. After dropping, the reaction was performed while stirring for 4 hours, the product was cooled to room temperature, charcoal (an amount of 5 weight % with respect to the weight of the reaction product) was added, and stirring was further performed for 2 hours. Afterward, the resulting product was filtrated using a Celite filter to remove the platinum catalyst and the charcoal, dried with $MgSO_4$, and evaporated to remove the organic solvent and unreacted anhydride. Afterward, a crude reaction product was dried at 50° C. in a vacuum, thereby obtaining a curing agent represented by Formula D (equivalent weight of the anhydride: 330.48 g/mol).

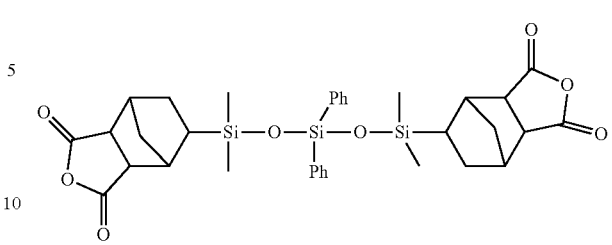

Formula D

SYNTHESIS EXAMPLE 5

Synthesis of Silicon-Modified Acid Anhydride Curing Agent (C)

The compound of Formula B was put into a double-neck rounded flask and diluted with a tetrahydrofuran (THF) solvent to have a concentration of 70 weight %. Subsequently, a platinum catalyst (Pt(0)-2,4,6,8-tetramethyltetravinylcyclotetrasiloxane) was added at 0.25 weight % with respect to the weight of the compound of Formula B. The flask was equipped with a condenser and a dropping funnel, and purged with nitrogen. Subsequently, the temperature was increased to 50° C., 2.10 equivalent weight of tetrahydrophthalic anhydride with respect to 1 equivalent weight of the compound of Formula B was slowly added in drops through the dropping funnel. After dropping, the reaction was performed while stirring for 4 hours, the product was cooled to room temperature, charcoal (an amount of 5 weight % with respect to the weight of the reaction product) was added, and stirring was further performed for 2 hours. Afterward, the resulting product was filtrated using a Celite filter to remove the platinum catalyst and the charcoal, dried with $MgSO_4$, and evaporated to remove the organic solvent and unreacted anhydride. Afterward, a crude reaction product was dried at 70° C. in a vacuum, thereby obtaining a curing agent represented by Formula E (equivalent weight of the anhydride: 318.47 g/mol).

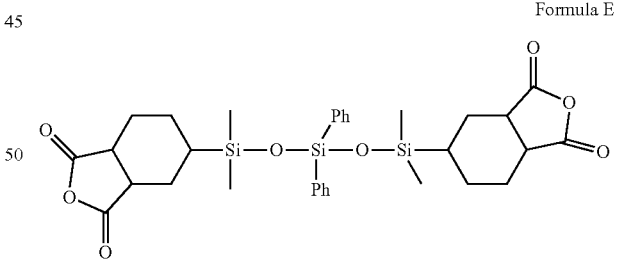

Formula E

SYNTHESIS EXAMPLE 6

Synthesis of Silicon-Modified Acid Anhydride Curing Agent (D)

(1) Synthesis of Silicon Compound

Dichlorophenylsilane and ether were put into a double-neck rounded flask, and 4 equivalent weight of water with respect to 1 equivalent weight of the dichlorophenylsilane was slowly added at 0° C. After the addition, the resulting mixture was stirred at room temperature for 4 hours, washed three times with water, dried with MgSO$_4$, and filtrated to remove the organic solvent, thereby obtaining a compound of Formula F (in Formula F, n is a number from 2 to 4).

(HO)(Ph$_2$SiO$_{2/2}$)$_n$(OH)      Formula F

The compound of Formula F was added to the double-neck rounded flask, anhydrous ether was added at a weight 12 times the weight of phenyl groups included in the compound of Formula F, and the mixture was stirred. HSiMe$_2$Cl (4.0 equivalent weight with respect to the compound of Formula F) and triethylamine (3.7 equivalent weight with respect to 1 equivalent weight of the compound of Formula F) were respectively poured into two separate funnels, and simultaneously added, at a higher speed for the HSiMe$_2$Cl than for the triethylamine, at 0° C. to react. After termination of the reaction, anhydrous ether was suitably added in consideration of stirring efficiency, the temperature was increased to room temperature, and stirring was performed for 4.5 hours. After stirring, a resulting salt component was filtrated using a glass filter, the anhydrous ether was washed, and an organic layer was washed twice with distilled water. Afterward, the reaction product was washed using a NaHCO$_3$ aqueous solution to neutralize, and further washed twice with distilled water. Sequentially, the resulting product was dried with MgSO$_4$ and filtrated to remove the organic solvent, thereby obtaining a silicon compound of Formula G with a yield of approximately 85% (In Formula G, n is a number from 2 to 4).

(Me$_2$HSiO$_{1/2}$)(Ph$_2$SiO$_{2/2}$)$n$(Me$_2$HSiO$_{1/2}$)      Formula G (2) Synthesis of Silicon-Modified Acid Anhydride Curing Agent (H)

The compound of Formula G was put into a double-neck rounded flask and diluted with a THF solvent so as to control a concentration to be 70 weight %. Subsequently, a platinum catalyst (Pt(0)-2,4,6,8-tetramethyltetravinylcyclotetrasiloxane) was added at 0.25 weight % with respect to the weight of the compound of Formula G. The flask was equipped with a condenser and a dropping funnel and purged with nitrogen. Subsequently, the temperature was increased to 50° C. and 2.10 equivalent weight of maleic anhydride with respect to the compound of Formula G was slowly added in drops through the dropping funnel. After dropping, the reaction was performed while stirring for 4 hours, the product was cooled to room temperature, charcoal (an amount of 5 weight % with respect to the weight of the reaction product) was added, and stirring was further performed for 2 hours. Afterward, the resulting product was filtrated using a Celite filter to remove the platinum catalyst and the charcoal, dried with MgSO$_4$, and evaporated to remove the organic solvent and unreacted anhydride. Afterward, a crude reaction product was dried at 50° C. in a vacuum, thereby obtaining a curing agent represented by Formula H (equivalent weight of the anhydride: 462.67 g/mol) (In Formula H, n is a number from 2 to 4).

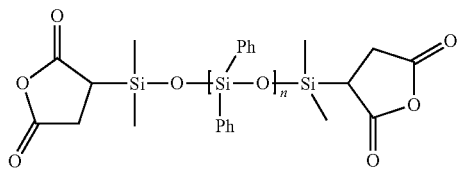

Formula H

SYNTHESIS EXAMPLE 7

Synthesis of Silicon-Modified Acid Anhydride Curing Agent (E)

(1) Synthesis of Silicon Compound

Methylphenyldisilanol (Aldrich) was put into a double-neck rounded flask and anhydrous ether was added and stirred.

HSiMe$_2$Cl (4.0 equivalent weight with respect to the disilanol) and triethylamine (3.7 equivalent weight with respect to 1 equivalent weight of the disilanol) were respectively poured into two separate funnels, and simultaneously added, at a higher speed for the HSiMe$_2$Cl than for the triethylamine, at 0° C. to react. After termination of the reaction, anhydrous ether was suitably added in consideration of stirring efficiency, the temperature was increased to room temperature, and stirring was performed for 4.5 hours. After stirring, a salt component was filtrated using a glass filter, the anhydrous ether was washed, and an organic layer was washed twice with distilled water. Afterward, the reaction product was washed using a NaHCO$_3$ aqueous solution to neutralize, and further washed twice with distilled water. Sequentially, the resulting product was dried with MgSO$_4$, and filtrated to remove the organic solvent, thereby obtaining a silicon compound of Formula I with a yield of approximately 85%.

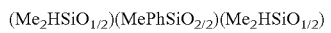
(Me$_2$HSiO$_{1/2}$)(MePhSiO$_{2/2}$)(Me$_2$HSiO$_{1/2}$)      Formula I (2) Synthesis of Silicon-Modified Acid Anhydride Curing Agent (E)

The compound of Formula I was put into a double-neck rounded flask and diluted with a THF solvent to have a concentration of 70 weight %. Subsequently, a platinum catalyst (Pt(0)-2,4,6,8-tetramethyltetravinylcyclotetrasiloxane) was added at 0.25 weight % with respect to the weight of the compound of Formula I. The flask was equipped with a condenser and a dropping funnel and purged with nitrogen. Subsequently, the temperature was increased to 50° C. and 2.10 equivalent weight of maleic anhydride with respect to 1 equivalent weight of the compound of Formula I was slowly added in drops through the dropping funnel. After dropping, the reaction was performed while stirring for 4 hours, the product was cooled to room temperature, charcoal was added (an amount of 5 weight % with respect to the weight of the reaction product), and stirring was further performed for 2 hours. Afterward, the resulting product was filtrated using a Celite filter to remove the platinum catalyst and the charcoal, dried with MgSO$_4$, and evaporated to remove the organic solvent and unreacted anhydride. Afterward, a crude reaction product was dried at 50° C. in a vacuum, thereby obtaining a curing agent represented by Formula J (equivalent weight of the anhydride: 264.37 g/mol).

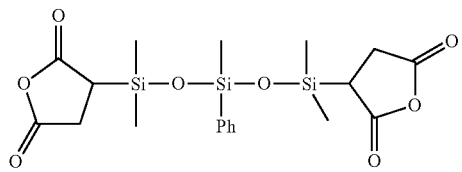

Formula J

EXAMPLE 1

100 parts by weight of the compound of Formula A prepared in Synthesis Example 1, 20.5 parts by weight of the compound of Formula C prepared in Synthesis Example 3, and 1 part by weight of tetrabutylphosphonium bromide were mixed in a nitrogen atmosphere and defoamed until the entire mixture became uniform, thereby preparing a curable composition. Subsequently, the curable composition was injected into a cup-shaped mold having a length of 2 mm in a nitrogen atmosphere, and maintained at 160° C. for 1 hour to cure.

EXAMPLE 2

100 parts by weight of the compound of Formula A prepared in Synthesis Example 1, 25.6 parts by weight of the compound of Formula D prepared in Synthesis Example 4, and 1 part by weight of tetrabutylphosphonium bromide were mixed in a nitrogen atmosphere and defoamed until the entire mixture became uniform, thereby preparing a curable composition. Subsequently, the curable composition was injected into the same mold as used in Example 1 in a nitrogen atmosphere, and maintained at 160° C. for 1 hour to cure.

EXAMPLE 3

100 parts by weight of the compound of Formula A prepared in Synthesis Example 1, 24.7 parts by weight of the compound of Formula E prepared in Synthesis Example 5, and 1 part by weight of tetrabutylphosphonium bromide were mixed in a nitrogen atmosphere and defoamed until the entire mixture became uniform, thereby preparing a curable composition. Subsequently, the curable composition was injected into the same mold as used in Example 1 in a nitrogen atmosphere, and maintained at 160° C. for 1 hour to cure.

EXAMPLE 4

100 parts by weight of the compound of Formula A prepared in Synthesis Example 1, 35.8 parts by weight of the compound of Formula H prepared in Synthesis Example 6, and 1 part by weight of tetrabutylphosphonium bromide were mixed in a nitrogen atmosphere and defoamed until the entire mixture became uniform, thereby preparing a curable composition. Subsequently, the curable composition was injected into the same mold as used in Example 1 in a nitrogen atmosphere, and maintained at 160° C. for 1 hour to cure.

COMPARATIVE EXAMPLE 1

100 parts by weight of 3,4-epoxycyclohexylmethyl 3,4-epoxycyclohexane carboxylate, 133.3 parts by weight of an organic curing agent (hexahydro-4-methylphthlic anhydride) and 1 part by weight of tetrabutylphosphonium bromide were mixed in a nitrogen atmosphere and defoamed until the entire mixture became uniform, thereby preparing a curable composition. Subsequently, the curable composition was injected into the same mold as used in Example 1 in a nitrogen atmosphere, and maintained at 160° C. for 1 hour to cure.

COMPARATIVE EXAMPLE 2

100 parts by weight of the compound of Formula A prepared in Synthesis Example 1, 13 parts by weight of an organic curing agent (hexahydro-4-methylphthlic anhydride), and 1 part by weight of tetrabutylphosphonium bromide were mixed in a nitrogen atmosphere and defoamed until the entire mixture became uniform, thereby preparing a curable composition. Subsequently, the curable composition was injected into the same mold as used in Example 1 in a nitrogen atmosphere, and maintained at 160° C. for 1 hour to cure.

COMPARATIVE EXAMPLE 3

100 parts by weight of the compound of Formula A prepared in Synthesis Example 1, 20.5 parts by weight of the compound of Formula J prepared in Synthesis Example 7, and 1 part by weight of tetrabutylphosphonium bromide were mixed in a nitrogen atmosphere and defoamed until the entire mixture became uniform, thereby preparing a curable composition. Subsequently, the curable composition was injected into a cup-shaped mold having a length of 2 mm in a nitrogen atmosphere, and maintained at 160° C. for 1 hour to cure.

COMPARATIVE EXAMPLE 4

100 parts by weight of the compound of Formula B prepared in Synthesis Example 2, 20.5 parts by weight of the compound of Formula C prepared in Synthesis Example 3, and 1 part by weight of tetrabutylphosphonium bromide were mixed in a nitrogen atmosphere and defoamed until the entire mixture became uniform, thereby preparing a curable composition. Subsequently, the curable composition was injected into a cup-shaped mold having a length of 2 mm in a nitrogen atmosphere, and maintained at 160° C. for 1 hour to cure.

COMPARATIVE EXAMPLE 5

100 parts by weight of the compound of Formula B prepared in Synthesis Example 2, 20.5 parts by weight of the compound of Formula J prepared in Synthesis Example 7, and 1 part by weight of tetrabutylphosphonium bromide were mixed in a nitrogen atmosphere and defoamed until the entire mixture became uniform, thereby preparing a curable composition. Subsequently, the curable composition was injected into a cup-shaped mold having a length of 2 mm in a nitrogen atmosphere, and maintained at 160° C. for 1 hour to cure.

Results of measuring physical properties of the cured products of Examples and Comparative Examples are summarized and listed in Table 1.

TABLE 1

| | | Example | | | | Comparative Example | | | | |
|---|---|---|---|---|---|---|---|---|---|---|
| | | 1 | 2 | 3 | 4 | 1 | 2 | 3 | 4 | 5 |
| Initial light transmittance | 350 nm | ○ | ○ | ○ | ○ | ○ | Δ | ○ | ○ | ○ |
| | 450 nm | ○ | ○ | ○ | ○ | ○ | Δ | Δ | Δ | ○ |
| Thermal resistance | | ○ | ○ | ○ | ○ | x | Δ | ○ | ○ | ○ |
| Light resistance | | ○ | ○ | ○ | ○ | ○ | ○ | ○ | ○ | ○ |
| Surface stickiness | | ○ | ○ | ○ | ○ | ○ | Δ | x | x | x |

The invention claimed is:
1. A curable composition, comprising:
a silicon resin which comprises a cyclic ether group and an aryl group and of which a molar ratio of the aryl group with respect to the silicon atoms is more than 0.5; and
a silicon modified alicyclic acid anhydride curing agent which comprises an aryl group and of which a molar ratio of the aryl group with respect to the silicon atoms is more than 0.5,
wherein the silicon resin is represented by an average composition formula of Formula 1:

$$(R_3SiO_{1/2})_a(R_2SiO_{2/2})_b(RSiO_{3/2})_c(SiO_{4/2})_d \quad \text{Formula 1}$$

where R's are substituents binding to silicon atoms, and each independently hydrogen, a hydroxyl group, a cyclic ether group, an acryl group, a methacryl group, an acryloyl group, a methacryloyl group, an isocyanate group, an alkoxy group or a monovalent hydrocarbon group, at least one R's is a cyclic ether group, at least one R's is an aryl group, and, in case where a+b+c+d is converted into 1, a is from 0 to 0.5, b is from 0 to 0.3, c is from 0.3 to 0.85, and d is from 0 to 0.2.

2. The curable composition according to claim 1, wherein the molar ratio of the cyclic ether groups in the silicon resin with respect to the silicon atoms in the silicon resin is from 0.05 to 0.3.

3. The curable composition according to claim 1, wherein the cyclic ether group is an epoxy group, an oxetane group, an epoxyalkyl group, a glycidyloxy alkyl group, or an alicyclic epoxy group.

4. The curable composition according to claim 1, wherein the silicon resin has the average composition formula of Formula 1 and comprises a siloxane unit represented by Formula 2:

$$[R^1 SiO_{3/2}] \quad \text{Formula 2}$$

where $R^1$ is a cyclic ether group.

5. The curable composition according to claim 1, wherein the silicon resin has the average composition formula of Formula 1 and comprises a siloxane unit represented by Formula 3 or 4:

$$[R^2 R^3 SiO_{2/2}] \quad \text{Formula 3}$$

$$[R^4 SiO_{3/2}] \quad \text{Formula 4}$$

where $R^2$ and $R^3$ are each independently an alkyl group or an aryl group, at least one of $R^2$ and $R^3$ is an aryl group, and $R^4$ is an aryl group.

6. The curable composition according to claim 1, wherein, in Formula 1, at least one of R's is an alicyclic hydrocarbon group.

7. The curable composition according to claim 1, wherein the silicon resin has a weight average molecular weight of 1,500 to 7,000.

8. The curable composition according to claim 1, wherein the curing agent is represented by Formula 8:

$$R^6{}_e R^7{}_f SiO_{(4-e-f)/2} \quad \text{Formula 8}$$

where $R^6$ is

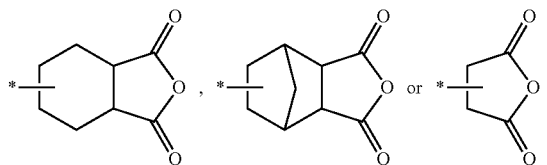

or an alkyl group subject to substitution with at least one of the functional groups, $R^7$ is hydrogen, a hydroxyl group, a monovalent hydrocarbon group or —$OR_8$, in which $R_8$ is a monovalent hydrocarbon group, e and f are numbers satisfying $0 < e \le 3$, $0 < f \le 2.5$, $0 < e+f \le 3$. When $R^6$ and $R^7$ are plural, they may be equal to or different from each other.

9. The curable composition according to claim 1, wherein the curing agent is represented by Formula 9:

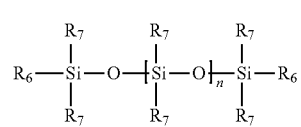

Formula 9 where each $R_9$ is independently

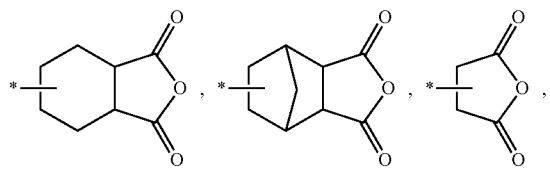

hydrogen, a hydroxyl group, a monovalent hydrocarbon group or —$OR_8$, or an alkyl group subject to substitution with

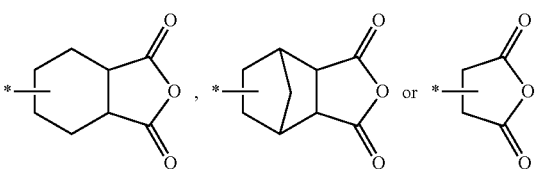

$R_8$ is a monovalent hydrocarbon group, at least one $R_9$ is

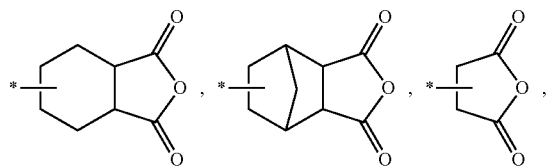

or an alkyl group subject to substitution with

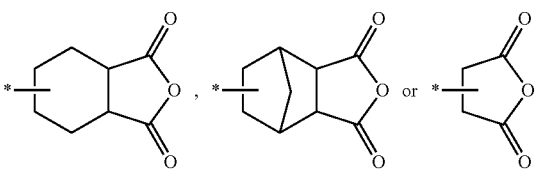

and n is a number from 0 to 10.

10. The curable composition according to claim 1, wherein the curing agent is represented by Formula 10:

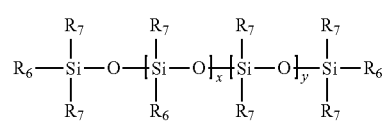

Formula 10 where $R_6$ is,

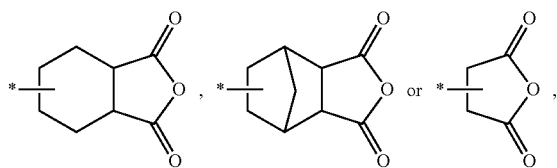

or an alkyl group subject to substitution with at least one of the functional groups, $R_7$ is an alkyl group or an aryl group, each of x and y is an integer of 0 or more, and x+y is 0 to 10.

11. The curable composition according to claim 1, wherein the curing agent is represented by Formula 11:

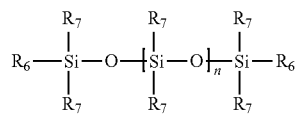

Formula 11 where $R_6$ is

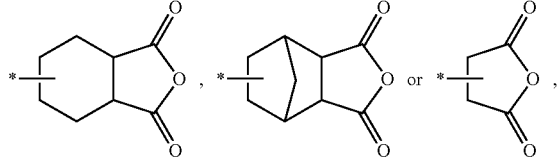

or an alkyl group subject to substitution with at least one of the functional groups, $R_7$ is an alkyl group or an aryl group, and n is 0 to 10.

12. The curable composition according to claim 1, wherein the silicon modified alicyclic acid anhydride curing agent is comprised in an amount of 5 to 60 parts by weight relative to 100 parts by weight of the silicon resin.

13. The curable composition according to claim 1, further comprising a curing catalyst.

14. The curable composition according to claim 1, further comprising an organic compound having at least two epoxy groups in the molecule.

15. A light emitting diode, comprising a light emitting device coated with the cured curable composition of claim 1.

16. A liquid crystal display, comprising the light emitting diode of claim 15 as a backlight.

17. A lighting apparatus, comprising the light emitting diode of claim 15.

* * * * *